United States Patent [19]

Court et al.

[11] Patent Number: 5,276,854
[45] Date of Patent: Jan. 4, 1994

[54] METHOD OF MULTIPLE CPU LOGIC SIMULATION

[75] Inventors: Thomas L. Court; Alan Rivers, both of Eau Claire, Wis.

[73] Assignee: Cray Research, Inc., Eagan, Minn.

[21] Appl. No.: 570,120

[22] Filed: Aug. 17, 1990

[51] Int. Cl.$^5$ .............................................. G06F 9/455
[52] U.S. Cl. ................................ 395/500; 364/221.2; 364/916.3; 364/DIG. 1; 364/DIG. 2
[58] Field of Search ................. 395/DIG. 1, DIG. 2, 500, 800; 364/578

[56] References Cited

U.S. PATENT DOCUMENTS

| 4,961,156 | 10/1990 | Takasaki | 364/578 |
| 5,018,089 | 5/1991 | Kanazawa | 364/578 |

Primary Examiner—Robert B. Harrell
Attorney, Agent, or Firm—Merchant, Gould, Smith, Edell, Welter & Schmidt

[57] ABSTRACT

Software simulation of a multiple CPU computer system design utilizes integer type program statements having program variables typed as integer that correspond to the boolean input variables of the design equations. Each of the program variables is assigned to a digital word having at least as many bits as the number of CPUs, with the boolean value of variables for each CPU represented by one of the bits in the word as a binary one or zero. The program statements are executed on a computer and evaluated to provide a result word wherein the individual bits of the result word represent the logic output state of the boolean equation for each CPU.

1 Claim, 1 Drawing Sheet

METHOD OF MULTIPLE CPU LOGIC SIMULATION

TECHNICAL FIELD OF THE INVENTION

The present invention pertains generally to the field of logic simulation, and more particularly to the simulation of multiprocessing systems.

CROSS REFERENCES TO RELATED APPLICATIONS

This application is related to U.S. Ser. No. 07/569,068 entitled "Method for Running Diagnostics on a CPU Logic Simulator," filed on even data herewith.

BACKGROUND OF THE INVENTION

A logic simulator is a software program or hardware device that emulates exactly how the logic it simulates will function. It is primarily used to verify the integrity of new designs, but can also be used to evaluate the performance of new and existing designs. The simulator of the present invention is a compiled two-valued rank-ordered boolean-level software type simulator, wherein program variables are used to represent boolean logic terms and program statements are used to evaluate the boolean equations of the design. Simulators of this type typically include a translator which can read the circuit boolean equations of the design and automatically generate the simulator program which, when executed on a computer, simulates the operation of the design.

For an illustration of the basic simulation method of the present invention, consider a "black box" logic device having eight inputs A-H and eight outputs (Y0-Y7). The logic desired is to assert one of eight outputs (Y0-Y7) depending on the state of eight input lines (A-H), such that input A has highest priority and input H has lowest. The function desired is specified in the following truth table:

| H | G | F | E | D | C | B | A | Y0 | Y1 | Y2 | Y3 | Y4 | Y5 | Y6 | Y7 |
|---|---|---|---|---|---|---|---|----|----|----|----|----|----|----|----|
| X | X | X | X | X | X | X | 1 | 1 | 0 | 0 | 0 | 0 | 0 | 0 | 0 |
| X | X | X | X | X | X | 1 | 0 | 0 | 1 | 0 | 0 | 0 | 0 | 0 | 0 |
| X | X | X | X | X | 1 | 0 | 0 | 0 | 0 | 1 | 0 | 0 | 0 | 0 | 0 |
| X | X | X | X | 1 | 0 | 0 | 0 | 0 | 0 | 0 | 1 | 0 | 0 | 0 | 0 |
| X | X | X | 1 | 0 | 0 | 0 | 0 | 0 | 0 | 0 | 0 | 1 | 0 | 0 | 0 |
| X | X | 1 | 0 | 0 | 0 | 0 | 0 | 0 | 0 | 0 | 0 | 0 | 1 | 0 | 0 |
| X | 1 | 0 | 0 | 0 | 0 | 0 | 0 | 0 | 0 | 0 | 0 | 0 | 0 | 1 | 0 |
| 1 | 0 | 0 | 0 | 0 | 0 | 0 | 0 | 0 | 0 | 0 | 0 | 0 | 0 | 0 | 1 |
| 0 | 0 | 0 | 0 | 0 | 0 | 0 | 0 | 0 | 0 | 0 | 0 | 0 | 0 | 0 | 0 |

The truth table inputs in this example suggest a priority function, and the output suggests a decode function. One possible solution for this design objective is:

```
t = 0
    A0 = A + b C + b d E + b d f G
    A1 = A + B + c d E + c d F
    A2 = A + B + C + D
    E0 = A + B + C + D + E + F + G + H
t = 1
    Y0 = A2 A1 A0 E0
    Y1 = A2 A1 a0 E0
    Y2 = A2 a1 A0 E0
    Y3 = A2 a1 a0 E0    (lowercase terms are
    Y4 = a2 A1 A0 E0     complements of the
    Y5 = a2 A1 a0 E0     uppercase)
    Y6 = a2 a1 A0 E0
    Y7 = a2 a1 a0 E0
```

The Y0-Y7 equations are obviously a 3-to-8 decode of A0-A2 (along with enable term E0), but it is not obvious at first glance that A0-S2 represent an 8-to-3 priority encoder function of inputs A-H. Explained below is how a designer, using logic simulation, can be sure that A0-S2 along with E0 will create the Y-terms as required in the truth table.

The boolean logic set forth above can be simulated in a computer program by converting the boolean equations to corresponding computer program statements. To do so, program variables are used to represent variables in the boolean equations. For example, the variables $L_0$, G1, G2, G3, G4, G5, G6, G7 and G8 can be assigned to represent the boolean variables A0, A, B, C, D, E, F, G and H, respectively. With these assignments, the boolean formula for A0 set forth above would be written as a FORTRAN statement as follows:

$L_0$=G1.or.(.n.G2.and.G3).or.(.n.G2.and.n.G-4.and.G5) .or.(.n.G2.and.n..G4.and..n.G6.and.G7)

Similar statements can be written for the boolean equations for A1, A2, E0 and Y0-Y7 terms. The statements are then sequenced to form a logic simulation program that emulates the logic flow. Simulation can thus be carried out by defining the initial logical state of each variable in an input file (for example, A=1, B=1, C=0 . . . H=0) and executing the compiled simulator program. The program will thus output or determine a value for each of the Y0-Y7 terms based on the input data. This output can then be analyzed to see that the logic in fact operates as intended. Preferably, as noted above, a program is provided for automatically converting input boolean equations and wire tab files to a corresponding simulator program.

There are three distinct levels at which a designer may use a logic simulator in the design of a computer system. The first level consists of testing the logic of an IC design, as, for example, illustrated in the example above given. At times a small circuit can be quite tricky, and the simulator can help an engineer "one and zero it out", or verify its operation. The second level is testing at the multiple IC or module level. Inputs are specified in a special file, and outputs (or any boolean terms) can be monitored to see if they come out as expected. The last level of simulation involves assembling the new module(s) into a complete CPU simulator program to simulate the execution of instructions and diagnostics.

At the first two levels of simulation, a designer may spend considerably more time analyzing the output than actually executing code, for deciding if the boolean worked correctly requires a rigorous digging through the output, boolean term by boolean term. At the CPU level, however, one need only check the pass and error counts to determine if a diagnostic passed or failed. If it failed, the diagnostic is run again and again while tracing relevant terms, much like probing on a real piece of hardware, or stepping through a program with a debugger to find software problems.

CPU simulation is a rigorous test of design correctness, where simulation occurs at the chip level all the way to user programs at the complete system level. Also, with multiple CPU systems it becomes increasingly important that the areas of the machine like the memory port and inter-CPU communications are thoroughly tested, which is best done at the system level. To accomplish this the simulator must be capable of simulating multiple CPUs all possibly "running" different programs.

The prior art provides at least two different ways to simulate multiple CPU systems. Since the boolean for one CPU is usually the same as any of the other CPU's, the simplest method re-generates the necessary simulation code for each CPU. If, for example, a simulator for one CPU uses 100000 lines of code this method requires N*100,000 lines of code (where N is the number of CPU's to simulate), and takes N times longer to execute than the simulation for one CPU would take. Another prior art method generates the code for one CPU but executes it N times. This eliminates the redundant code, but it still requires N times as much space for the variables to represent the boolean terms and takes N times as long to simulate. Accordingly, these prior art techniques become increasingly unworkable as the number of CPUs that need to be simulated increases. For instance, if it took two days worth of CPU time to simulate a single CPU simulation, a 16 processor system would take 32 days.

SUMMARY OF THE INVENTION

The present invention provides a method of simulating the hardware design of a multiple CPU computer system, wherein the CPU's have a common design and the design is specified in boolean logic equations. The method includes creating a program statement for a boolean logic equation of the design, with the statement having program variables typed as integers that correspond to the boolean input variables of the equation, and with each of the program variables assigned to a digital word having at least as many bits as the number of CPUs. The method further provides, for each CPU, a true/false input value for each input variable, with true and false values being represented by the binary values 1 and 0, respectively. The method further comprises packing the word assigned to each term with the input values for each CPU, wherein the values for each CPU are packed in corresponding bit positions in each word. Finally, the method provides that the program statement is executed on a computer so that it is evaluated to provide a result word wherein the individual bits of the result word represent the logic output state of the boolean equation for each CPU.

Accordingly, the present invention provides a method for "packing" program variables with data from multiple CPUs wherein the variables can be used in program statements to simultaneously evaluate the boolean logic for a plurality of CPUs.

DETAILED DESCRIPTION OF THE INVENTION

Figure 1:
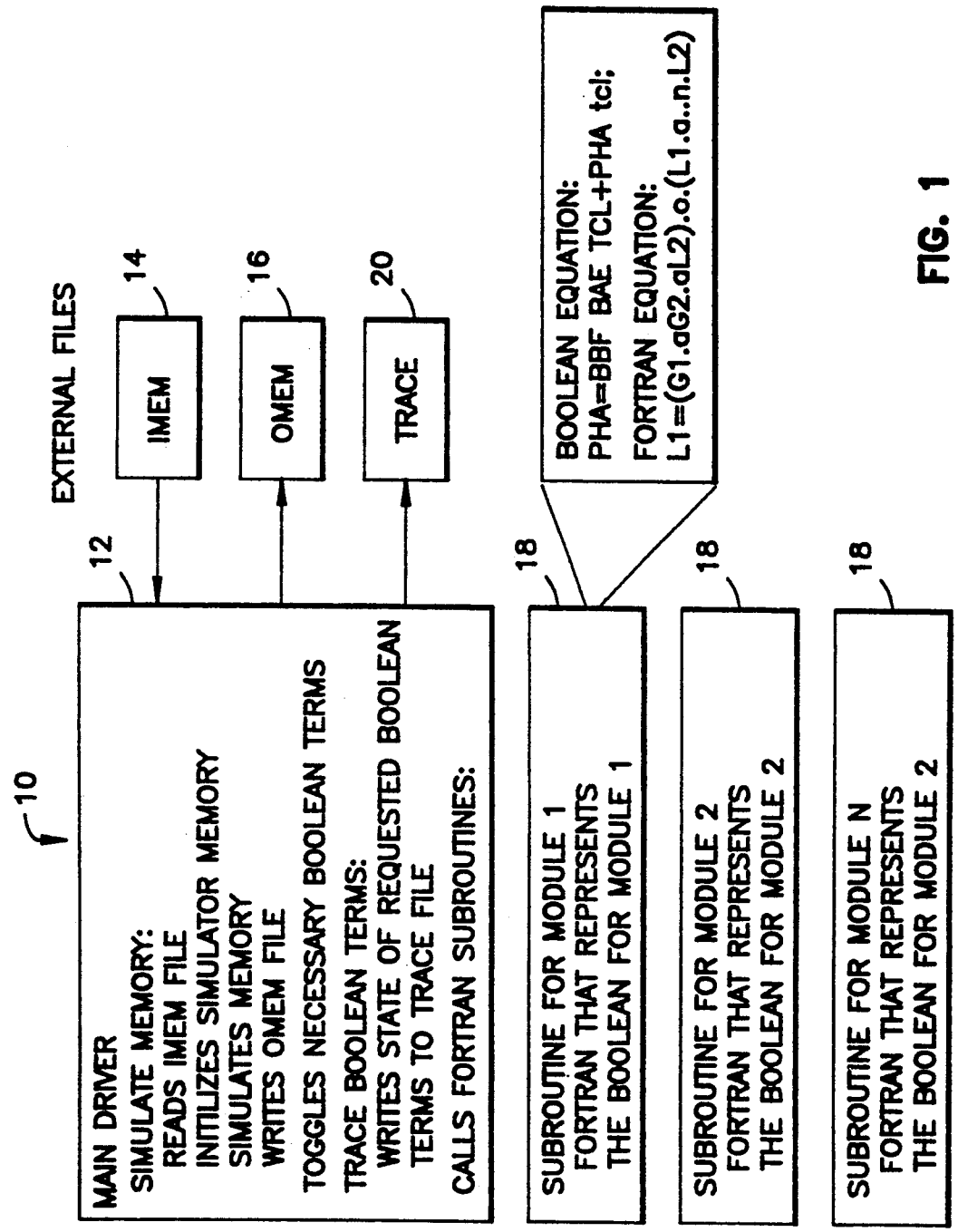
FIG. 1 is a simplified block diagram of the logic simulator software according to the present invention.

Generally, as shown in FIG. 1, the logic simulator program 10 of the present invention comprises a collection of FORTRAN modules 18 and a main driver 12. The main driver 12 of the simulator is responsible for emulating system "memory", reading the input memory file (IMEM) 14, writing to an output memory file (OMEM) 16, calling the FORTRAN modules or subroutines 18 in proper order, displaying or outputting requested boolean terms in a trace file 20, and for allowing a user to selectively toggle or change the value of boolean terms. The IMEM file 14 contains initial data or values for program variables (i.e., initial logic states), simulated memory or registers, or a combination of initial values and "machine" instructions as, for example, where the execution of instructions or programs thereof are simulated (for information on the use of diagnostic programs to verify designs in a simulator, see co-pending patent application Ser. No. 07/569,068, entitled "METHOD FOR RUNNING DIAGNOSTICS ON A CPU LOGIC SIMULATOR", filed on even date herewith). A FORTRAN module 18 consists of FORTRAN statements that represent the boolean equations for a portion of the logic being simulated. Typically, one FORTRAN module 18 represents the boolean for one hardware module in a system.

As noted, prior art simulators represent all the boolean terms with program variables that are type logical. In the FORTRAN language, for instance, a logical entity is a single true or false value, which occupies one computer word, and cannot be used as a number. For example:

Given these inputs:

| | |
|---|---|
| BBF = true | (T) |
| BAE = false | (f) |
| TCL = false | (f) |
| PHA = true | (T) |

The following boolean equation would result in true:

$PHA = BBF\ BAE\ TCL + PHA\ tcl;$ $T = T \cdot f \cdot f + T \cdot T$

The present invention provides a multiple CPU simulator which evaluates the boolean for all CPUs in parallel, thus greatly reducing the execution time required for simulation. This is accomplished by using integer type program variables instead of the logical types used in the prior art. Since most of the boolean equations for one CPU are the same as any of the other CPUs the information for all the CPUs can be "packed" into one word and the boolean equations evaluated just once for all CPUs.

By changing the representation of the boolean terms from type logical to type integer the value of the boolean terms can be a number rather than just true or false. Moreover, by using each bit position in the integer program variable to represent one of the CPUs, the boolean equations for all CPUs can be evaluated simultaneously.

For example, assume the simulation of four CPUs, each of which has the following boolean equation.

| PHA = BBF BAE TCL + PHA tcl; | | | | | |
|---|---|---|---|---|---|
| CPU 1's inputs are | T | T | f | f | T |
| CPU 2's inputs are | f | f | f | T | T |
| CPU 3's inputs are | T | T | T | f | f |
| CPU 4's inputs are | f | f | T | f | f |

Evaluating each CPU independently the results are:

| CPU 1 | PHA = f |
|---|---|
| CPU 2 | PHA = T |
| CPU 3 | PHA = T |
| CPU 4 | PHA = f |

If a type integer is used, a true can be represented with a one and a false with a zero. The inputs for each CPU can be "packed" into one word as follows.

```
|<—— 64 bit CRAY word ——>|

CPU—>  4  3  2  1
BBF =   | zeros          | 0| 1 | 0 | 1 |  = 5
                                         (octal)

BAE =   | zeros          | 0| 1 | 0 | 1 |  = 5
                                         (octal)

TCL =   | zeros          | 1| 1 | 0 | 0 |  = 14
                                         (octal)

PHA =   | zeros          | 0| 0 | 1 | 0 |  = 2
                                         (octal)

tcl =   | zeros          | 0| 0 | 1 | 1 |  = 3
                                         (octal)
```

Evaluating the boolean equation with integers results in:

```
PHA = (BBF.and.BAE.and.TCL).or.(PPH.and.tcl)
    = ( 5  .and.  5  .and.  14 ).or.( 2  .and. 3 )
    = (         4            ).or.(     2       )
    = 6
```

Expanding the result (6) back into binary format, one sees that the result matches the method that uses logical variable types.

```
                CPU—>  4  3  2  1
PHA   | zeros        | 0| 1 | 0 | 1 |  = 6
```

CPU 1 PHA = 0 or false
CPU 2 PHA = 1 or true
CPU 3 PHA = 1 or true
CPU 4 PHA = 0 or false The end result is that numbers propagate through the boolean equations rather than a true or false. Moreover, it is possible to simulate up to N CPUs simultaneously, where N is the number of bits in a word. Where, for example, a word is 64-bits wide, up to 64 processors can be simulated simultaneously.

While the "parallel" simulation technique of the present invention greatly speeds simulation, it does entail some additional work in tracing boolean terms when necessary to debug a design. In particular, in the prior art method, a value (true or false) of a variable directly corresponds to the logic state of that variable's corresponding boolean term. Thus, a variable can be traced directly using the tracing capabilities of the computer language system used for the simulation. With the simulation technique of the present invention, however, this prior art method will not work. Instead, the present invention provides for tracing by extracting the individual bits (representing the logic state of the variable for a given CPU) of each variable word and assigning each extracted bit a location in an array. The values of interest in that array can be specified by the user and printed out.

Extraction is accomplished by taking the logical product (and operation) of the variable and a bit mask for the CPU of interest. For example, to find the state of term XYZ of CPU 2:

```
XYZ =        | 0———0 | 1 | 0 | 1 | 1 |

Bit mask for
CPU 2 =      | 0———0 | 0 | 0 | 1 | 0 |

Result =     | 0———0 | 0 | 0 | 1 | 0 |
```

If result is non-zero then XYZ for CPU 2 is true or else XYZ for CPU 2 is false.

The parallel simulation method of the present invention is limited to use in simulating those parts of the system wherein each CPU's boolean and wire connections are identical. When they are not, a method of disassembly of certain bits has to be performed. An example of where this can happen is in the wire connections between the CPU and memory. In a multiprocessing system each CPU often has its own path and control into memory. For example, given the following connections:

| | SOURCE | | | DESTINATION | |
|---|---|---|---|---|---|
| CPU | module | term | → | module | term |
| 1 | AR | RAA | | TF | IAA |
| 2 | AR | RAA | | TF | IAB |
| 3 | AR | RAA | | TF | IAC |
| 4 | AR | RAA | | TF | IAD | the following disassembly would have to be done:

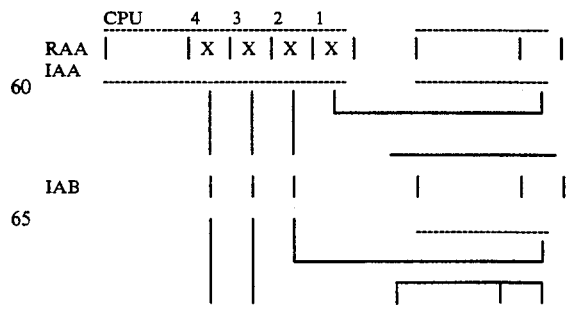

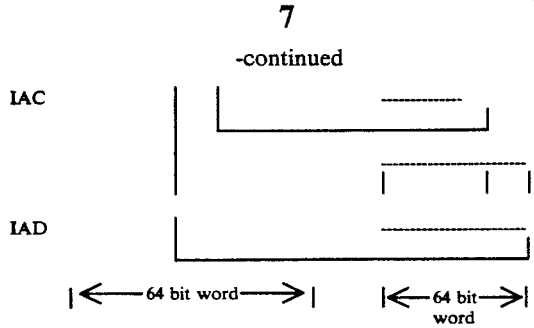

This disassembly process thus provides an individual variable for each CPU so that this variable can be evaluated independently of the corresponding variables for the other CPUs. Simulating using these disassembled variables is accomplished in the same manner as provided in the prior art, i.e. each disassembled variable represents the logic state associated with a single CPU. After simulating CPU-specific portions of the design with the disassembled variables, the disassembled variables can be reassembled to a single word to continue parallel simulation of common design elements.

To accomplish parallel simulation, the main driver module 12 of the present invention includes code for reading multiple input memory files 14 and segmenting simulated memory with the contents of those files, "deadstarting" multiple CPUs, and managing a corresponding number of trace files (one for each CPU). At the start of simulation, each CPU has a separate memory image file containing the instruction sequence or diagnostic to be executed. The simulator reads these files and assigns each CPU a different section of simulator memory in which to run that code.

While the parallel simulation method of the present invention is described as applied to simulation at the system level, it can also be applied where multiple IC's or modules are used. Moreover, while the present invention is described as implemented using the FORTRAN programming language, it is in no way limited in this respect. For example, the C, PASCAL and ADA languages can equally well be used.

While the present invention is described in connection with the preferred embodiment thereof, it will be understood that many modifications will be readily apparent to those of ordinary skill in the art, and this application is intended to cover any adaptations or variations thereof. Therefore it is manifestly intended that this invention be limited only by the claims and the equivalents thereof.

We claim:

1. A method of simulating on a simulation computer a hardware design of a computer system having a number of CPUs, wherein said CPUs have a common design, said design specified in boolean logic equations, comprising the steps of:

(a) creating, in said simulation computer, a program statement for a boolean logic equation of the design, said boolean logic equation operating on boolean input variables, said program statement having program variables typed as integers that correspond to said boolean input variables, each of said program variables assigned to a digital word having at least as many bits as the number of said CPUs;

(b) providing, in said simulation computer for each of said CPUs, a true/false input value for each of said boolean input variables, true and false values being represented by a binary value 1 and 0, respectively;

(c) said simulation computer packing the digital word assigned to each of said program variables with the true/false input values for each of said CPUs wherein the true/false input values for each of said CPUs are placed in corresponding bit-positions in each said digital word; and (d) executing the program statement on said simulation computer so that the program statement is evaluated to provide a result word wherein the individual bits of the result word represent the logic output state of the boolean logic equation of each of said CPUs.

* * * * *

UNITED STATES PATENT AND TRADEMARK OFFICE
CERTIFICATE OF CORRECTION

PATENT NO.    :    5,276854
DATED         :    January 4, 1994
INVENTOR(S)   :    Thomas L. Court et al.

It is certified that error appears in the above-identified patent and that said Letters Patent is hereby corrected as shown below:

On cover page, [54], please delete "METHOD OF MULTIPLE CPU LOGIC SIMULATION" and insert --METHOD FOR SOFTWARE SIMULATION OF A HARDWARE DESIGN OF A CPU--.

At Column 1, line 14, please delete "data" and insert --date--.

Signed and Sealed this

Twenty-third Day of September, 1997

*Attest:*

BRUCE LEHMAN

*Attesting Officer*    Commissioner of Patents and Trademarks